United States Patent [19]

Nishimura et al.

[11] Patent Number: 4,845,537
[45] Date of Patent: Jul. 4, 1989

[54] VERTICAL TYPE MOS TRANSISTOR AND METHOD OF FORMATION THEREOF

[75] Inventors: Tadashi Nishimura; Kazuyuki Sugahara; Shigeru Kusunoki; Akihiko Ohsaki, all of Hyogo, Japan

[73] Assignee: Mitsubishi Denki Kabushiki Kaisha, Tokyo, Japan

[21] Appl. No.: 127,138

[22] Filed: Dec. 1, 1987

[30] Foreign Application Priority Data

Dec. 1, 1986 [JP] Japan .............................. 61-287322

[51] Int. Cl.⁴ .................... H01L 29/78; H01L 27/02; H01L 29/04
[52] U.S. Cl. ............................. 357/23.4; 357/23.6; 357/41; 357/45; 357/51; 357/56; 357/59
[58] Field of Search ................... 357/59 E, 23.6, 23.4, 357/41, 45, 51, 56

[56] References Cited

U.S. PATENT DOCUMENTS 3,912,546 10/1975 Hunsperger et al. ............. 357/23.2
4,291,327  9/1981 Tsang ................................. 357/23.2
4,466,008  8/1984 Beneking ............................. 357/56
4,503,449  3/1985 David et al. ....................... 357/23.4
4,713,678 12/1987 Womack et al. ..................... 357/41
4,755,867  7/1988 Cheng ................................. 357/23.4
4,763,180  8/1988 Hwang et al. ...................... 357/23.4

Primary Examiner—Eugene R. LaRoche
Assistant Examiner—Michael B. Shingleton
Attorney, Agent, or Firm—Sughrue, Mion, Zinn, Macpeak & Seas

[57] ABSTRACT

A vertical MOS transistor having its channel length determined by the thickness of an insulating layer provided over a semiconductor substrate, rather than by the depth of a trench in which the transistor is formed. As a result, the characteristics of the transistor as relatively unaffected by doping and heat-treatment steps which are performed during formation. Also, the transistor may be formed so as to occupy very little surface area, making it suitable for application in high-density DRAMs.

7 Claims, 4 Drawing Sheets

VERTICAL TYPE MOS TRANSISTOR AND METHOD OF FORMATION THEREOF CRT

BACKGROUND OF THE INVENTION

This invention relates to a vertical type MOS transistor, a plurality of which may be arranged on a surface of a semiconductor chip so as to yield high density. Such a transistor may be used, for example, as part of a cross-point memory cell in a dynamic random access memory (DRAM).

Until now, very large scale integration (VLSI) in semiconductor devices has been carried out by microscopic techniques. However, recently the limit of these microscopic techniques has been reached. Accordingly, lithography techniques have been implemented in hopes not only of surpassing this limit, but also of improving the structure of semiconductor devices.

FIGS. 1 and 2 are a plan view and a cross-sectional view of a cross-point cell proposed as a basic cell of a DRAM in accordance with what has just been discussed. The cross-point cell has been disclosed in an article entitled "FAM 19.5: A 4Mb DRAM with Cross-Point Trench Transistor Cell", by Ashwin H. Shah et al., ISSCC 86, Feb. 21, 1986, pp. 268–269 and also in an article entitled "A Trench Transistor Cross-Point DRAM Cell" by W. F. Richardson et al., IEDM 85, pp. 714–717.

In FIG. 1, an n+ diffused region 1 and a poly-Si layer 2 are disposed orthogonally with respect to each other in a plane. A trench 3 is located at a cross-point between the diffused region 1 and the layer 2, and a cross-point memory cell is formed in the trench. The portion of the diffused region 1 in the vicinity of the memory cell functions as the drain region of a MOS transistor, and the portion of the diffused region 1 located between the drain regions functions as a bit line. The portion of the layer 2 located in the vicinity of the memory cell functions as a gate electrode of the transistor, and the portions of the layers 2 located between the gate electrodes function as a word line.

In FIG. 2, a semiconductor substrate 11 comprises a p+ type substrate 11a and a p type epitaxial layer 11b. The trench 3 is formed through the major surface of the epitaxial layer 11b and into the substrate 11a. A storage dielectric layer 9 is formed along the side walls and the bottom of the trench 3. A poly-Si storage node 8 is put in a bottom portion of the trench 3 and is insulated from the semiconductor substrate 11 by the storage dielectric layer 9. The storage node 8, the dielectric layer 9, and the substrate 11a together constitute the capacitor of the cross-point DRAM cell.

An n-type buried lateral contact 7 is diffused in the epitaxial layer 11b and connected to the upper end of the storage node 8. The buried lateral contact 7 functions as the source of MOS transistor in the cross-point cell. A gate insulator 6 is formed on the top of the storage node 8, along the side wall of the epitaxial layer 11b facing the trench 3, and on the major surface of the epitaxial layer 11b surrounding the trench 3. A gate electrode 10 is formed on the gate insulator 6 located on top of the storage node 8, along the side wall of the epitaxial layer 11b, and over the gate insulator 6 surrounding the trench 3. The gate electrode 10 is the part of the poly-Si layer 2.

A diffused region 1 is formed in the major surface of the epitaxial layer 11b surrounding the trench 3. Part of the region 1 contacts the gate insulator 6. A channel region 5 is formed along the sidewall of the epitaxial layer 11b facing the trench 3 between the diffused region 1 and the buried electrical contact 7. A field insulator 4 is formed on the major surface of the epitaxial layer 11b surrounding the diffused layer 1 and part of it contacts the diffused region 1.

In the above constructed cross-point memory cell, the lengths $W_1$ and $W_2$, as shown in FIG. 1, are 2.6 μm and 3.4 μm.

Next, the process of the above-described conventional semiconductor memory device with a plurality of cross-point cells will be explained. As shown in FIG. 3(a), the trench 15 is formed through the major surface of the epitaxial layer 11b and into the substrate 11a for each memory cell region by RIE. The field insulator 14 is formed in the major surface of the epitaxial layer 11b surrounding and separating the trenches 15. The diffused region 13 is formed by ion injection in the major surface of the epitaxial layer 11b surrounding the trench 15. One side of the diffused region 13 contacts the sidewall of the trench 15 and other side contacts an end of the field insulator 14. A thin insulating layer 16 is formed on the sidewalls and bottom of the trench 15 and the major surface of the epitaxial layer 11b between the trench 15 and the field insulator 14.

In FIG. 3(b), a n+ poly-Si layer 17 is put in the trench so as to fill all of the trench 15 within the substrate 11a and part of the trench extending through the epitaxial layer 11b, and then the upper portions of the insulating layer 16 are etched to a point below the level of the poly-Si layer 17. As a result, a gap 18 is formed between the poly-Si layer 16 and the epitaxial layer 11b.

In FIG. 3(c), a thin poly-Si layer is deposited on the poly-Si layer 17 to fill the gap 18. The remaining thin poly-Si other than that in the gap 18 is removed by an appropriate directional etching method. As a result, a buried lateral contact is formed. Thus, the capacitor is formed by the poly-Si layer 17, the insulating layer 16 and the substrate 11b.

In FIG. 3(d), a gate insulator 19 is formed on top of the poly-Si layer 17, along the sidewall of the trench 15 within the epitaxial layer 11b, and over the diffused region 13. A gate electrode 20 is formed on the gate insulator 19. The gate electrode 20 and the word line are formed at the same time, the gate electrode 20 being part of the word line. Thus, the MOS transistor is formed by the diffused region 13, the buried lateral contact 21 formed in the previous step, the gate insulator 19 and the gate electrode 20.

In the above constructed semiconductor memory device, the distance between the top of the poly-Si layer 17 and the diffused region 13 constitutes the channel length of MOS transistor. Thus, the etching of the poly-Si layer 17 has to be controlled very accurately. Further, the doping of the channel region is remarkably influenced by auto-doping from the under layer during epitaxial growth and diffusion from the under layer during thermal treatment. As a result, the uniformity and reproduction of the proper characteristics of the MOS transistor are influenced considerably.

As the channel region is formed in the wall surface which faces in a different direction, non-uniformity of the threshold voltage of the MOS transistor results. Further, as the gap between the poly-Si layer and the epitaxial layer results from the formation of the additional thin poly-Si layer and then the removal of unnecessary portions of the thin poly-Si layer by plasma etching using CF4, crystal defects result in the semiconductor surface forming the channel region. As a result, the overall characteristic of the MOS transistor is degraded.

In view of the structure, when the distance between memory cells is shortened in the above semiconductor memory device, the transistor of one cross-point cell may cause charging of the capacitor of an adjacent cross-point cell, resulting in improper operation of the memory.

SUMMARY OF THE INVENTION

In view of the foregoing disadvantages, it is one object of the present invention to provide a vertical type MOS transistor having the correct channel length.

It is a further object of the invention to provide a vertical MOS transistor providing uniformity and reproduction of the appropriate characteristics.

It is another object of this invention to provide a vertical type MOS transistor which can be formed in a substrate with high density.

In order to accomplish these and other objects, the vertical type MOS transistor of the invention has a first source-drain region formed selectively in a semiconductor substrate, an insulating layer formed on the major surface of the substrate, a second semiconductor layer formed along the side walls and bottom wall of a trench region which is formed through the major surface of the insulating layer to at least the major surface of the first region, a third semiconductor layer, as a second source-drain region, formed continuously from the upper end of the second layer on the major surface of the insulating layer, a gate insulator formed on the surface of the second layer and third layer and facing at least the trench region, and a gate electrode formed on the gate insulator disposed in at least the trench region.

BRIEF DESCRIPTION OF THE DRAWINGS

The present invention now will be described in conjunction with the accompanying drawings, in which.

DETAILED DESCRIPTION OF THE PREFERRED EMBODIMENT

Figure 1:
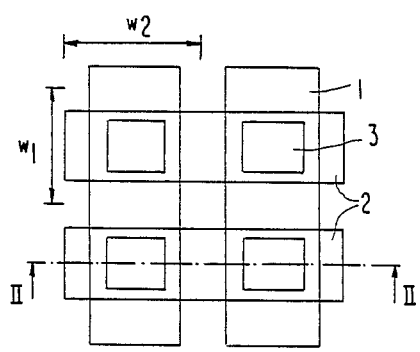
FIG. 1 is a plan view of a conventional cross-point cell.
Figure 2:
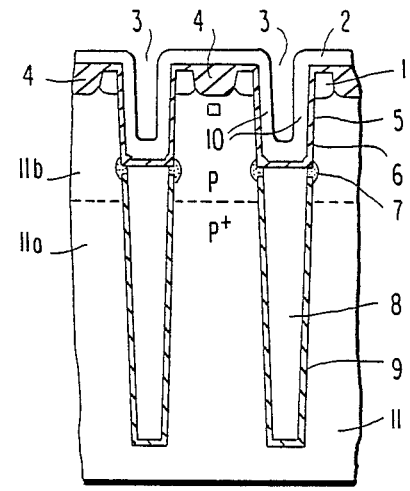
FIG. 2 is a cross-sectional view taken along a line II—II in FIG. 1.
Figure 3A:
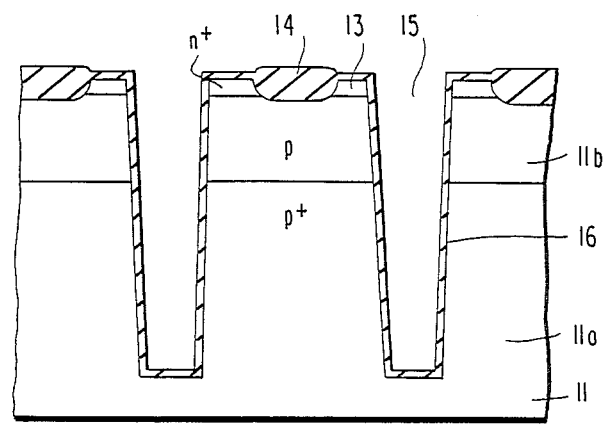
FIG. 3 is a cross-sectional view showing each formation step of the conventional cross-point cell.
Figure 3B:
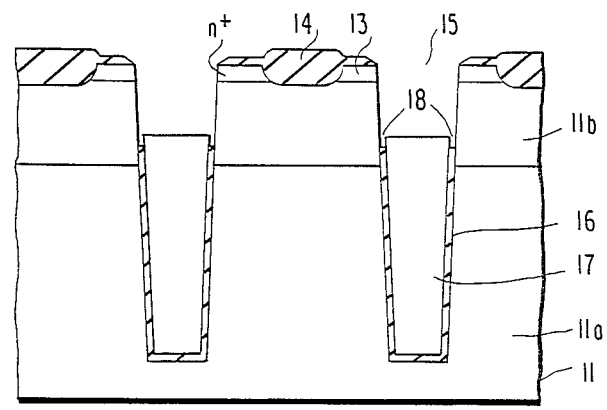
Figure 3C:
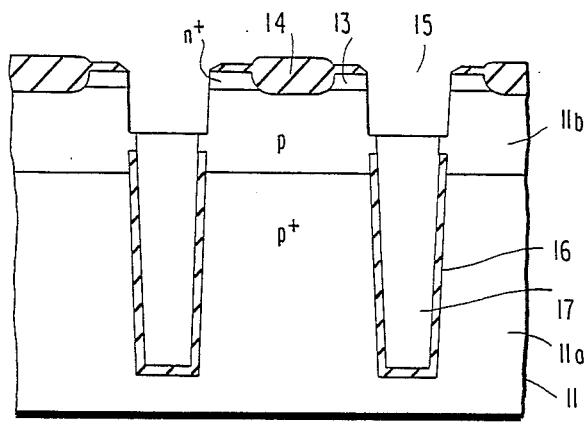
Figure 3D:
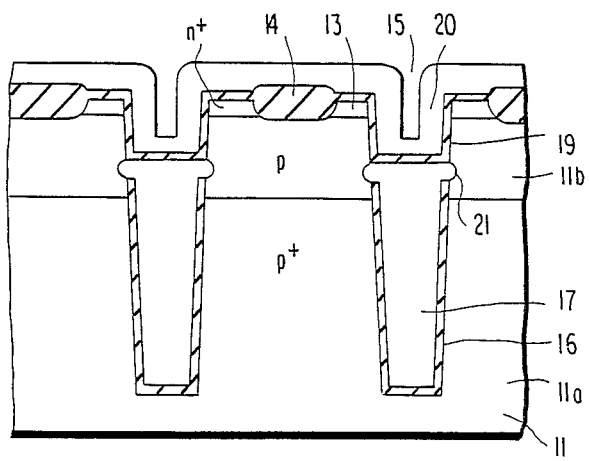
Figure 4:
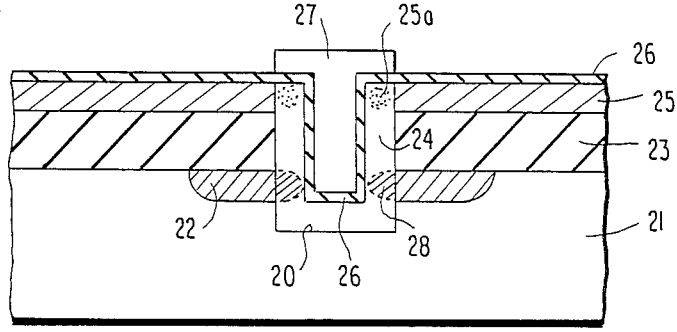
FIG. 4 is a cross-sectional view of a vertical MOS transistor in accordance with the present invention.

FIG. 4 shows a p-type Si monocrystalline semiconductor substrate 21 having a major surface of the (1,0,0) type. A first source-drain region 22 is formed selectively in the major surface of the semiconductor substrate 21 by high density doping of arsenic. A 1 $\mu$m thick insulating SiO$_2$ layer 23 also is formed on the major surface of the substrate 21. A trench 20 is formed through the major surface of the insulating layer 23 and into the substrate 21 through the center of the first source-drain region 22 by reactive ion etching (RIE). The side walls of the trench 20 form a 60° to 90° angle with the major surface of the substrate 21.

A second monocrystalline Si layer 24 is formed along the side walls and bottom of the trench 20. The second layer 24 is grown epitaxially by annealing the amorphous Si layer at about 600° C. A third semiconductor layer 25 is formed by high-density ion implantation of As continuously from the upper end of the second layer 24 on the major surface of the insulating layer 23. At this time, the layer 25 is used as a mask. On the other hand, during this heat treatment appropriate impurities are diffused in the region 25a just underlying where the gate electrode will be, and so the region 25a becomes a part of a second source-drain region.

An n-type region 28 is simultaneously formed by diffusing impurities from the first source-drain region 22, so that the region 28 becomes a part of the first source-drain region. The part of the second semiconductor layer 24 between the regions 25a and 28 functions as a channel region, and the length of the channel region is the same as the thickness of the insulating layer 23. An SiO$_2$ gate insulator 26 is formed on the second and third layers 24 and 25. A poly-Si or silicide gate electrode 27 is formed on the gate insulator disposed in and near the trench 20.

Next, the steps for producing the above described vertical MOS transistor will be explained.

Figure 5A:
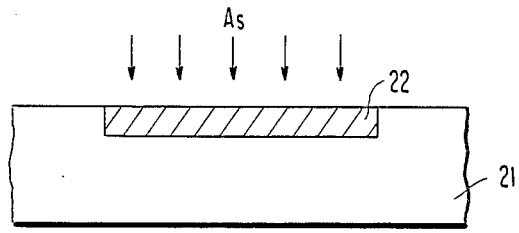
FIG. 5 is a cross-sectional view showing each step of formation of the vertical MOS transistor in accordance with the present invention.
Figure 5B:
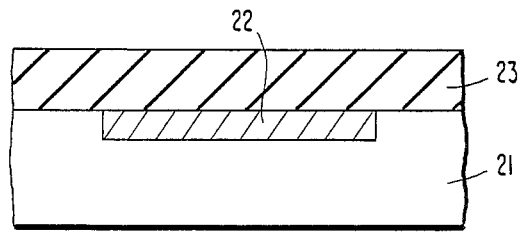

First, as shown in FIG. 5(a), As is ion-implanted selectively in the major surface of the semiconductor substrate 21 to a concentration of $2 \times 10^5$/cm$^2$ at 50 keV by a photo-lithographic method, and then the diffused region 22, which is used as the first source-drain region, is formed by heat-treatment. The 1 $\mu$m thick SiO$_2$ insulating layer 23 is formed on the major surface of the semiconductor substrate 21 by low pressure chemical vapor deposition (CVD), as shown in FIG. 5(b).

Figure 5C:
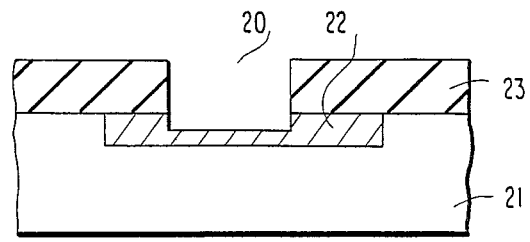

The insulator 23 and the diffused region 22 are simultaneously etched to form the trench 20 having a vertical side wall, as shown in FIG. 5(c).

Figure 5D:
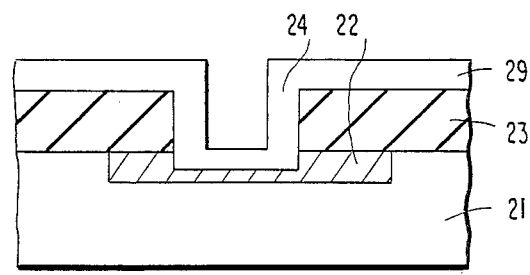

The poly-Si layer 29, which constitutes the second and third semiconductor layers, is deposited on all of the major surface of the insulator 23 by low pressure CVD to a thickness of 2000 Å, and then Si is ion implanted obliquely in the layer 29 to a concentration of $5 \times 10^{15}$/cm$^2$ at 50 keV. As a result, the layer 29 is changed to an amorphous-Si layer. The heat-treatment is continuously done at 600° C. for 8 hours. As a result, the amorphous Si layer 29 located near the side wall of the insulator 23 facing the trench 20 is changed to a monocrystalline Si layer 24, as shown in FIG. 5(d), as the layer 29 grows epitaxially up along the side wall of the insulator 23 to pick up the crystallization of the monocrystalline Si in the diffused region 22.

Figure 5E:
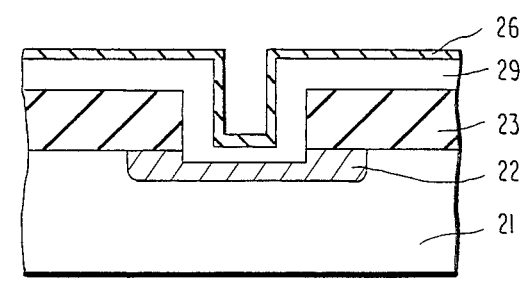

Next, as shown in FIG. 5(e), material is oxidized in the presence of dry O$_2$ at 100° C. to form a 200 Å thick gate insulation 26 on the layer 29.

Figure 5F:
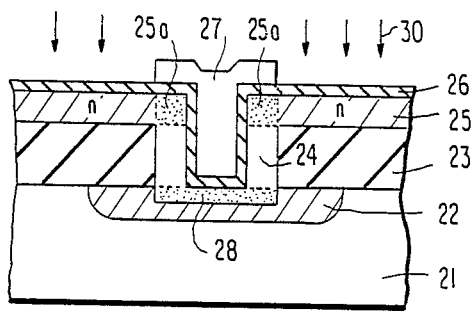

A poly-Si layer, which is phosphorous-doped, is deposited on the gate insulator 26 and in the trench 20, and pattern-etched to from a gate electrode 27 on the gate insulator 26 and disposed at least in the trench 20, as shown in FIG. 5(f).

Arsenic (As) ions are continuously implanted in the semiconductor layer 29 over the gate insulator 26, as shown in FIG. 5(f), so that the surface layer of the semiconductor layer is changed to an n type layer 25. As ions, implanted in the layer 25, are diffused in the upper end of the monocrystalline Si layer 24 by heat-treating, and the resulting diffused region 25a becomes a part of second source-drain region. Arsenic ions, which are in the first source-drain region 22, similarly, are diffused in the bottom of the monocrystalline Si layer 24 by this heattreating and the resulting diffused region 28 also becomes a part of the first source-drain region 22. As a result, the channel region of the MOS transistor is the layer 24 between the diffused regions 25a and 28, and the length of the channel region is the same as the thickness of the insulator 23.

In the vertical MOS transistor thus produced, the length of the channel is determined by the thickness of the insulator 23, and is not influenced by the depth of the trench 20. Accordingly, the characteristic of the transistor is not influenced by any unevenness of etching in formation of the trench 20. For example, when the transistor as shown in FIG. 4 and the transistor as shown in FIG. 5(f) are compared, the trenches have different depths, but if the thicknesses of both insulators are the same, the length of both channels are the same and the characteristics of both transistors are the same without being influenced by the depth of the trench.

In other words, since the characteristic of the transistor is not influenced by the depth of the trench, and it is easier to control the thickness of the insulator 23, the the uniformity and reproducibility of the characteristics of the vertical MOS transistor are most satisfactory.

On the other hand, as shown in FIG. 4 and FIG. 5(f), the vertical MOS transistor in accordance with the invention is the kind of SOI (silicon on insulator) device which makes the under face of the transistor the side wall of the insulator 23 facing the trench 20. Accordingly, the vertical MOS transistor in accordance with the invention has a characteristic that the electric isolation between the adjoining transistors is certain because of the isolation provided by the insulator 23. And if the vertical MOS transistor in accordance with the invention is used as a switching transistor of memory cell of dynamic RAM (Random Access Memory), a high density DRAM is possible.

Figure 6:
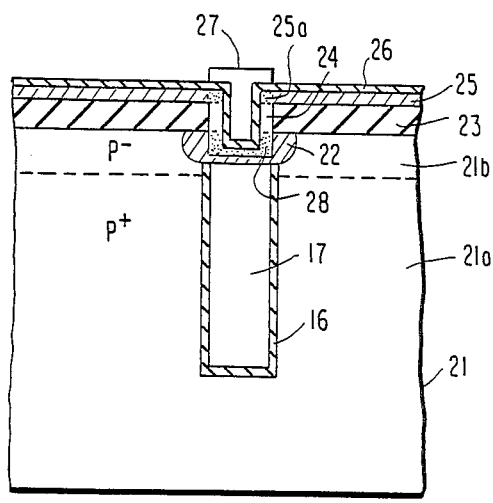
FIG. 6 is a cross-sectional view of a cross-point cell in accordance with the present invention.

FIG. 6 shows a cross-sectional view of the memory cell of a DRAM comprising a plurality of vertical MOS transistors in accordance with the invention. In FIG. 6, similar elements are similarly numbered as in FIG. 4. Referring to FIG. 6, a semiconductor substrate 21 has a P+ type substrate 21a and P− type epitaxial layer 21b. A capacitor of a cross-point memory cell is mainly formed in the substrate 21a, and the first source-drain region 22 is formed in the epitaxial layer 21b just on the capacitor region. One electrode of the capacitor includes the substrate 21a, and the other electrode of the capacitor includes n+ type poly-Si which is buried in the trench formed in the semiconductor substrate 21. The dielectric layer 16 is formed along the side walls and bottom of the trench between the substrate 21a and the poly-Si 17.

Figure 7:
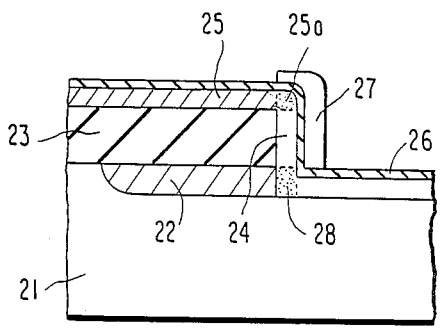
FIG. 7 is a cross-sectional view of another vertical MOS transistor in accordance with the present invention.

FIG. 7 shows a cross-sectional view of another vertical MOS transistor in accordance with the invention. In FIG. 7, similar elements are similarly numbered as in FIG. 4. The only difference between both embodiments as shown in FIG. 4 and 7 is whether the region in which the transistor is formed is all or part of the wall of the trench.

In the above embodiments, the trench 20 is a hole, but it may be a groove. Also, the angle which the side walls of this trench make with the substrate 21 may be 60° to 90°. Also, the gate electrode 27 may be silicide instead of poly-Si. Thus, what is specifically described as presently preferred is not intended to limit the scope of the invention. Rather, the invention is to be measured by the appended claims which follow immediately.

What is claimed is:

1. A vertical type MOS transistor comprising:
    (a) a semiconductor substrate (21);
    (b) a first source-drain region (22) of a first conductivity type and formed selectively in a major surface of said semiconductor substrate;
    (c) an insulating layer (23) formed on the major surface of said semiconductor substrate;
    (d) said first source-drain region and said insulating layer having a trench (20) formed therethrough, said trench extending from a major surface of said insulating layer into a major surface of said first source-drain region, said trench having side walls and a bottom;
    (e) a second semiconductor layer (24) formed along said side walls and said bottom of said trench, a portion of said second semiconductor layer at least along said side wall being of a second conductivity type, different from said first conductivity type;
    (f) a third semiconductor layer (25) of said first conductivity type formed continuously from an upper end of said second semiconductor layer on the major surface of said insulating layer;
    (g) said transistor including a second source-drain region (25a), said semiconductor substrate and said third semiconductor layer being separated by said insulating layer, and said first and second source-drain regions being separated by said second semiconductor layer, wherein a channel length of said transistor is determined by a thickness of said insulating layer, independent of a depth of said trench;
    (h) a gate insulator (26) formed on the surface of said second semiconductor layer and the third semiconductor layer and in said trench; and
    (i) a gate electrode (27) formed on said gate insulator disposed in at least said trench.

2. A vertical type MOS transistor according to claim 1, wherein said gate electrode comprises a polycrystalline semiconductor.

3. A vertical type MOS transistor according to claim 1, wherein said gate electrode comprises silicide.

4. A vertical type MOS transistor according to claim 1, wherein said second semiconductor layer comprises monocrystalline silicon.

5. A vertical type MOS transistor according to claim 1, wherein said side walls of said trench form an angle of 60° to 90° with the major surface of said semiconductor substrate.

6. A vertical type MOS transistor according to claim 1, wherein said trench extends halfway through said first region.

7. A cross-point cell having one vertical type MOS transistor and one storage means disposed under said transistor, said cell comprising:
    (a) a semiconductor substrate (21) of a first conductivity type;
    (b) a first source-drain region (22) of a second conductivity type, different from said first conductivity type, and formed selectively in a major surface of said semiconductor substrate;
    (c) an insulating layer (23) formed on the major surface of said substrate;
    (d) a second semiconductor layer (24) formed along side walls and a bottom of a trench (20) which extends from a major surface of said insulating layer into the major surface of said substrate, a portion of said second layer at least on said side wall being of said first conductivity type;

(e) a third semiconductor layer (25) of said second conductivity type formed continuously from an upper end of said said second layer on the major surface of said insulating layer (f) said third layer including a second source-drain region (25a) of said transistor, said semiconductor substrate and said third semiconductor layer being separated by said insulating layer, said first and second source-drain regions being separated by said second semiconductor layer, wherein a channel length of said transistor is defined by a thickness of said insulating layer, independent of a depth of said trench;

(g) a gate insulator (26) formed on the surface of said second layer and the third layer at least within said trench;

(h) a gate electrode (27) of said transistor formed on said gate insulator, and disposed in at least said trench;

(i) a first electrode (17) of said storage means formed just under said first source-drain region in said substrate and being of said second conductivity type; and (j) a storage dielectric layer (16) formed between said substrate and said first electrode.

* * * * *